United States Patent
Yan et al.

(10) Patent No.: US 11,039,246 B2
(45) Date of Patent: Jun. 15, 2021

(54) VOLUME ADJUSTING METHOD, DEVICE, AND TERMINAL DEVICE

(71) Applicant: GUANGDONG OPPO MOBILE TELECOMMUNICATIONS CORP., LTD., Guangdong (CN)

(72) Inventors: Fenggui Yan, Guangdong (CN); Zhaoan Xu, Guangdong (CN); Zhiyong Zheng, Guangdong (CN); Gaoting Gan, Guangdong (CN); Hai Yang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

(21) Appl. No.: 16/639,121

(22) PCT Filed: Aug. 18, 2017

(86) PCT No.: PCT/CN2017/098176
§ 371 (c)(1),
(2) Date: Feb. 13, 2020

(87) PCT Pub. No.: WO2019/033440
PCT Pub. Date: Feb. 21, 2019

(65) Prior Publication Data
US 2020/0213732 A1   Jul. 2, 2020

(51) Int. Cl.
*H04R 3/04* (2006.01)
*H04L 29/06* (2006.01)
(Continued)

(52) U.S. Cl.
CPC .............. *H04R 3/04* (2013.01); *H03G 3/24* (2013.01); *H03G 3/32* (2013.01); *H04L 65/601* (2013.01); *H04R 2430/01* (2013.01)

(58) Field of Classification Search
CPC .......... H04R 3/00; H04R 29/001; H03G 3/04; H03G 3/32; H03G 3/3005; H03G 3/24
(Continued)

(56) References Cited

U.S. PATENT DOCUMENTS 8,090,120 B2 * 1/2012 Seefeldt ............. G10L 21/0232
381/104
2009/0323985 A1 * 12/2009 Garudadri ............. H03G 3/004
381/104
(Continued)

FOREIGN PATENT DOCUMENTS

CN            1610451       4/2005
CN          101026363       8/2007
(Continued)

OTHER PUBLICATIONS

WIPO, ISR for PCT/CN2017/098176, May 23, 2018.
EPO, Extended European Search Report for EP Application No. 17921919.1, dated Jul. 29, 2020.

*Primary Examiner* — Disler Paul
(74) *Attorney, Agent, or Firm* — Hodgson Russ LLP

(57) ABSTRACT

The present disclosure provides a volume adjusting method, a device, and a terminal device. In the method, audio information of an audio source may be obtained when a terminal device is playing the audio source. An audio amplitude corresponding to the audio information is determined basing on the audio information. The audio amplitude is adjusted according to an amplitude adjustment coefficient, and the amplitude adjustment coefficient is assigned according to the value of the audio amplitude.

20 Claims, 5 Drawing Sheets

S101 — Audio information of an audio source is obtained when detecting that a terminal device is playing the audio source S102 — An audio amplitude corresponding to the audio information is determined basing on the audio information.

S103 — The audio amplitude is adjusted according to an amplitude adjustment coefficient, the amplitude adjustment coefficient is assigned according to the value of the audio amplitude

(51) Int. Cl.
*H03G 3/32* (2006.01)
*H03G 3/24* (2006.01)

(58) Field of Classification Search
USPC .............................. 381/56–57, 104–109, 103
See application file for complete search history.

(56) References Cited

U.S. PATENT DOCUMENTS

| | | | | |
|---|---|---|---|---|
| 2010/0012716 | A1* | 1/2010 | Lapstun | G06Q 50/22 235/375 |
| 2010/0185308 | A1 | 7/2010 | Yoshida et al. | |
| 2011/0044471 | A1* | 2/2011 | Aarts | H04R 3/04 381/98 |
| 2011/0081029 | A1* | 4/2011 | Hashimoto | H04R 3/04 381/107 |
| 2011/0305346 | A1* | 12/2011 | Daubigny | H03G 3/32 381/28 |
| 2012/0288121 | A1* | 11/2012 | Matsui | H03G 3/3089 381/107 |
| 2013/0064596 | A1* | 3/2013 | Le | A45D 34/04 401/213 |
| 2014/0016791 | A1* | 1/2014 | Smith | H03G 9/025 381/57 |
| 2014/0185833 | A1* | 7/2014 | Ikeda | H03G 7/002 381/107 |
| 2014/0334677 | A1* | 11/2014 | Kuo | G06T 7/70 382/103 |
| 2016/0360315 | A1* | 12/2016 | Matsuyama | H03F 1/0211 |
| 2018/0014121 | A1* | 1/2018 | Lawrence | H04R 3/007 |

FOREIGN PATENT DOCUMENTS

| | | |
|---|---|---|
| CN | 101026363 | 12/2010 |
| CN | 102610232 | 7/2012 |
| CN | 104105031 | 10/2014 |
| CN | 106161781 | 11/2016 |

* cited by examiner

VOLUME ADJUSTING METHOD, DEVICE, AND TERMINAL DEVICE

CROSS-REFERENCE TO RELATED APPLICATION

This application is a U.S. national phase application of International Application No. PCT/CN2017/098176, filed Aug. 18, 2017, the entire disclosure of which is incorporated herein by reference.

TECHNICAL FIELD

The present disclosure relates to the field of computer technologies in general. More particularly, and without limitation, the disclosed embodiments relate to volume adjusting method, device, terminal device, and storage medium.

BACKGROUND

With the increasing popularity of terminal device, more and more users use terminal device to perform various functions to meet their own needs. For example, users may read books, watch videos, listen to music, and play games via terminal devices.

SUMMARY

The present disclosure provides a volume adjusting a method, a device, a terminal device and a storage medium, which improves the efficiency of volume adjustment and reduces the power consumption of the terminal device.

According to a first aspect, a volume adjusting method is provided in accordance with the embodiments of the present disclosure. The method includes:

acquiring audio information of an audio source when detecting that a terminal device is playing the audio source;

determining an audio amplitude corresponding to the audio information according to the audio information; and adjusting the audio amplitude according to an amplitude adjustment coefficient. The amplitude adjustment coefficient is assigned according to the value of the audio amplitude.

According to a second aspect, a volume adjusting device is provided in accordance with the embodiments of the present disclosure. The volume adjusting device includes:

an obtaining module, configured to obtain audio information of an audio source when detecting that a terminal device is playing the audio source;

an amplitude determination module, configured to determine an audio amplitude corresponding to the audio information according to the audio information;

an adjustment coefficient determination module, configured to assign an amplitude adjustment coefficient according to the value of the audio amplitude; and an adjustment module, configured to adjust the audio amplitude according to the assigned amplitude adjustment coefficient.

According to a third aspect, a terminal device is provided in accordance with embodiments of the present disclosure. The terminal device includes a processor, a memory, and a computer program stored on the memory and executable by the processor, wherein the processor executes the computer program to perform the volume adjusting method according to the embodiments of the present disclosure.

According to a fourth aspect, a storage medium is provided in accordance with embodiments of the present disclosure. The storage medium contains instructions that is executable by a terminal device. The instructions are executed by a processor of the terminal device to perform the volume adjusting method according to the embodiments of the present disclosure.

BRIEF DESCRIPTION OF THE DRAWINGS

The accompanying drawings, which are incorporated in and constitute a part of this specification, illustrate exemplary embodiments of the present disclosure, and together with the description, serve to explain the principles of the disclosure.

DETAILED DESCRIPTION

Figure 1:
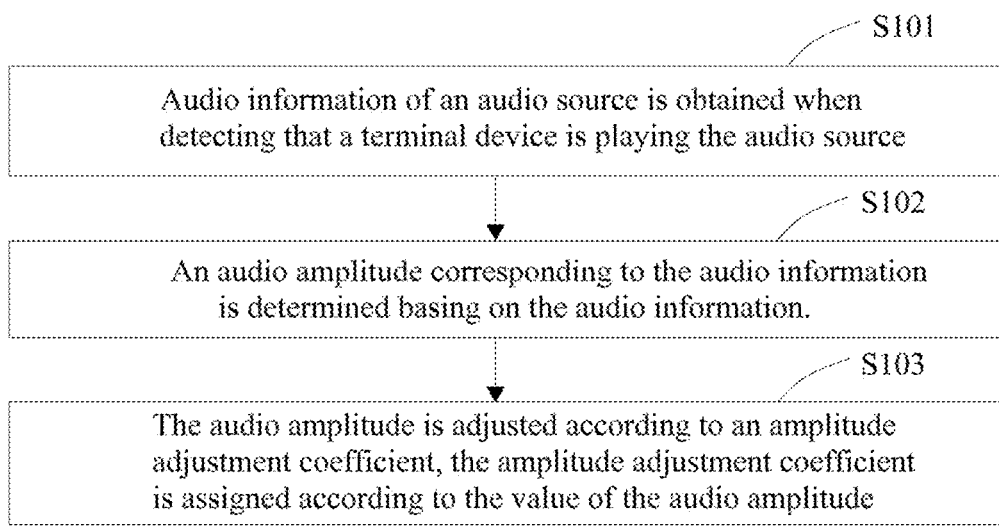
FIG. 1 illustrates a flowchart of a volume adjusting method, in accordance with an embodiment of the present disclosure.

The present disclosure will be further described in detail below with reference to the accompanying drawings and embodiments. It can be understood that the specific embodiments described herein are used to explain the present disclosure, but not to limit the present disclosure. In addition, it should be noted that, for convenience of description, only some but not all structures related to the present disclosure are illustrated in the drawings.

FIG. 1 illustrates a flowchart of a volume adjusting method, in accordance with an embodiment of the present disclosure. The illustrated embodiment may be applied to a case in which a volume of a terminal device needs to be adjusted when the terminal device is playing an audio source. The method may be performed by the terminal device according to an embodiment of the present disclosure. The volume adjusting device of the terminal device may be implemented by software and/or hardware. As illustrated in FIG. 1, the specific solution provided by the illustrated embodiment is as follows:

At the block S101, audio information of an audio source is obtained when detecting that a terminal device is playing the audio source.

The terminal device can play the audio source via a third-party application installed therein, or via an audio or video playback software integrated therein. When the terminal device is playing the audio source, it may obtain, decode, and output an audio source file corresponding to the audio source. Exemplarily, the audio source file obtained by the terminal device may be a multicast stream transmitted from a network. The audio source file obtained by the terminal device may also be an audio/video file stored locally in the terminal device. The terminal device may load the audio source file into a memory buffer thereof after obtaining the audio source file. And then the audio source file in the memory buffer is decoded. When the audio source file contains both of video data and audio data, the audio data should be separated from the video data before the audio source file is decoded. And the separated audio data is transmitted to an audio decoder. The audio decoder is mainly configured to read the audio data in the memory buffer, obtain digital audio signals, and convert the digital audio signals into analog audio signals. The playback component of the terminal device may paly audios according to the analog audio signals. In one embodiment, the terminal device is determined to start to play the audio source when an audio source playback event is triggered. The triggered audio source playback event may be detecting that a playback button on a touch display panel of the terminal device is pressed, or may be detecting that a playback component of the terminal device such as a speaker starts to generate sound signals, then the terminal device is determined to play the audio source.

The audio information of the audio source is obtained when it is detected that the terminal device is playing the audio source. In one embodiment, the digital audio signals decoded by the audio decoder may be sampled to obtain the audio information corresponding to the audio source. In another embodiment, an original file of the playing audio source may be obtained, and the audio information corresponding to the audio source may be obtained by analyzing the original file. In still another embodiment, taking the Android system as an example, the audio information of the audio source can be obtained via the android.media.MediaRecorder class or the android.media.AudioRecord class.

At the block S102, an audio amplitude corresponding to the audio information is determined basing on the audio information.

An amplitude indicates a maximum distance of an object from an original position when the object is vibrating. A loudness of the sound heard by the human ear is related to the audio amplitude of the audio source. The larger the amplitude is, the larger the loudness is. In one embodiment, the digital audio signals decoded by the audio decoder may be sampled to obtain amplitude information within a predetermined duration T. The amplitude information may include multiple amplitude values. An amplitude waveform of the audio source lasting in the predetermined duration T may be correspondingly formed according to the multiple amplitude values. In another embodiment, taking the Android system as an example, the multiple amplitude values can be correspondingly obtained after the audio information of the audio source has been obtained via the android.media.MediaRecorder class or the android.media.AudioRecord class. In another embodiment, when the audio information obtained at the block S101 is an original file corresponding to the audio source, the corresponding amplitude values may be obtained by analyzing the original file.

In one embodiment, when it is detected that the audio source is playing, the audio amplitude is determined every predetermined duration (such as 1s, 3s, or 10s). Alternatively, the audio amplitude of each audio frame of the audio information may also be determined in real time. Specifically, in the operation of determining the audio information of the audio source, audio frame information of the audio source is obtained. Correspondingly, in the operation of determining the audio amplitude of the audio source according to the audio information, the audio amplitude of each of the audio frames of the audio source is determined according to the audio frame information. Exemplarily, when the audio source is determined to be played, an audio frame sequence is obtained by analyzing the audio source file, and the audio amplitude of the audio frame is correspondingly determined according to each frame of the audio frame sequence.

At the block S103, the audio amplitude is adjusted according to an amplitude adjustment coefficient, the amplitude adjustment coefficient is assigned according to the value of the audio amplitude.

In one embodiment, different amplitude adjustment coefficients may be determined according to the determined values of the audio amplitude, and the audio amplitude is adjusted according to the amplitude adjustment coefficient. In the operation of adjusting the audio amplitude, the audio source file containing the audio information can be analyzed to obtain audio data, and the data in the obtained audio data which indicates the amplitude information can be modified and then encapsulated, so when the corresponding audio source file is read into the buffer and playing, the audio amplitude corresponding to the audio source file has been correspondingly adjusted. In an alternative embodiment, in the decoding process of playing the audio source, the obtained digital audio signals are analyzed to obtain amplitude data, the amplitude data may be multiplied by a corresponding adjustment coefficient to modify the value of the amplitude, and then the volume of the audio source may be adjusted. As a result, the volume of the audio source can be adjusted without changing a current volume of the terminal device. The adjustment operation to the volume of the audio source can performed before the audio source is read into the buffer, thereby a playback load may be reduced. In an alternative embodiment, the adjustment operation may be applied to the audio source that has been read into the buffer, thereby improving an efficiency of adjustment.

Specifically, when assigning the amplitude adjustment coefficient according to the value of the audio amplitude, a first amplitude adjustment coefficient is assigned to the audio amplitude whose value is greater than a first predetermined threshold or smaller than a third predetermined threshold, a second amplitude adjustment coefficient is assigned to the audio amplitude whose value is smaller than or equal to the first predetermined threshold but greater than a second predetermined threshold, and a third amplitude adjustment coefficient is assigned to the audio amplitude whose value is smaller than or equal to the second predetermined threshold but greater than the third predetermined threshold. The first amplitude adjustment coefficient is smaller than the second amplitude adjustment coefficient, and the second amplitude adjustment coefficient is smaller than the third amplitude adjustment coefficient. For example, the first amplitude adjustment coefficient may be 1, and the second amplitude adjustment coefficient may be 2, and the third amplitude adjustment coefficient may be 1.5. The first amplitude threshold can be −3 db, the second amplitude threshold can be −10 db, and the third amplitude threshold can be −50 db. Correspondingly, the correspondence of the audio amplitudes and the amplitude adjustment coefficients can be illustrated in the following table.

TABLE 1

| audio amplitude | amplitude adjustment coefficient |
|---|---|
| Greater than −3 db, or smaller than −50 db | 1 |
| Smaller than −10 db but greater than −50 db | 2 |
| Smaller than −3 db but greater than −10 db | 1.5 |

As illustrated in Table 1, there is no need to adjust the audio amplitude whose value is greater than −3 db or smaller than −50 db. When the audio amplitude is smaller than −3 db but greater than −10 db, which indicates that the audio amplitude belongs to a high amplitude region, the adjustment coefficient of 1.5 if assigned to the audio amplitude. When the audio amplitude is smaller than −10 db but greater than −50 db, which indicates that the audio amplitude belongs to a medium amplitude region, an amplitude coefficient of 2 is assigned to the audio amplitude, thereby significantly increasing the value of the audio amplitude. It can be known from the foregoing that when a terminal device is detected to play the audio source, the audio amplitude is automatically adjusted to obtain a suitable output volume, which makes the listening experience of the user better and improves the efficiency of volume adjustment.

In a possible embodiment, the amplitude adjustment coefficient may be determined according to a maximum amplitude and an average amplitude of the audio information, and the audio amplitude is adjusted according to the amplitude adjustment coefficient. For an example, when a difference between the maximum amplitude and the average amplitude meets a predetermined requirement, the amplitude adjustment coefficient is determined according to the maximum amplitude and the average amplitude. For another example, when the difference between the maximum amplitude and the average amplitude is a relatively large value (such as 0.2 dB), a larger audio amplitude is adjusted to reduce the volume of the playing audio source, which avoids that the audio source with a larger audio amplitude is played at an extremely great volume. Alternatively, when the difference between the maximum amplitude and the average amplitude does not meet the predetermined requirement, that is, the difference is not large, then the audio amplitude of the audio source is not adjusted.

In a possible embodiment, the amplitude adjustment coefficient may be determined in advance according to the audio amplitude and a current volume value of the terminal device, and then the audio amplitude is adjusted according to the amplitude adjustment coefficient. For example, the terminal device may have a volume parameter divided in to 18 levels from zero to maximum in total, and the 18 levels may be adjusted. Each of the levels corresponds to a volume value. Correspondences of the levels and the volume values are illustrated in the following table.

TABLE 2

| Audio amplitude | Volume value (level) | adjustment coefficient |
|---|---|---|
| Greater than −3 db | 5 | 0.5 |
| Smaller than −3 db but greater than −10 db | 15 | 0.8 |
| Smaller than −20 db | 18 | 2 |

As illustrated in Table 2, when the audio amplitude is greater than −3 db and the current volume value of the terminal device is in a relative lower level, the amplitude adjustment coefficient is correspondingly determined to be 0.5, thereby reducing an amplitude of a higher part of the audio amplitude. When the audio amplitude is smaller than −3 db and greater than −10 db, and the current volume value of the terminal device is in a moderate level, the adjustment coefficient is correspondingly determined to be 0.8, thereby slightly adjusting an amplitude of a mid-amplitude of the audio amplitude. When the audio amplitude is smaller than −20 db and the current volume value of the terminal device is in a relative higher level, an amplitude of a lower part of the audio amplitude is increased accordingly.

Figure 2:
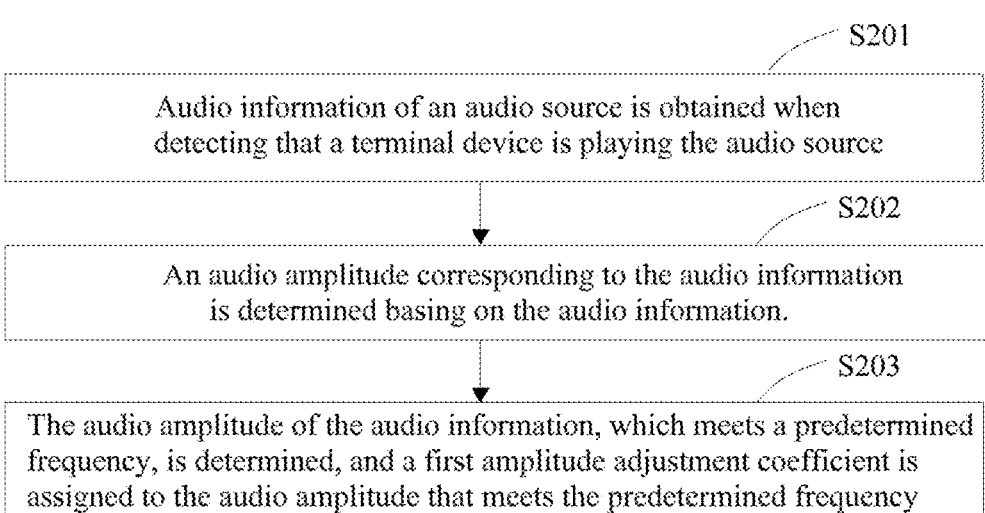
FIG. 2 illustrates a flowchart of another volume adjusting method, in accordance with another embodiment of the present disclosure.

FIG. 2 illustrates a flowchart of another volume adjusting method, according to another embodiment of the present disclosure. Alternatively, before assigning the amplitude adjustment coefficient to the audio source according the value of the audio amplitude, the method further includes: determining the audio amplitude of the audio information which meets a predetermined frequency. Correspondingly, when the amplitude adjustment coefficient is assigned according to the value of the audio amplitude, the operation may include: assigning a first amplitude adjustment coefficient to the audio amplitude that meets the predetermined frequency. As illustrated in FIG. 2, the technical solution is as follows.

At the block S201, audio information of an audio source is obtained when detecting that a terminal device is playing the audio source.

At the block S202, an audio amplitude corresponding to the audio information is determined, basing on the audio information.

At the block S203, the audio amplitude of the audio information which meets a predetermined frequency, is determined, and a first amplitude adjustment coefficient is assigned to the audio amplitude that meets the predetermined frequency.

The first amplitude adjustment coefficient may be 1, that is, the audio amplitude is not adjusted. For example, the predetermined frequency may be 300 hz, that is, when the audio amplitude of the audio information is determined to have a frequency maintaining at 300 hz, the audio amplitude may be determined as amplitude of noise and not adjusted, thereby avoiding synchronously amplifying the noise, and improving an efficiency of volume adjustment.

Figure 3:
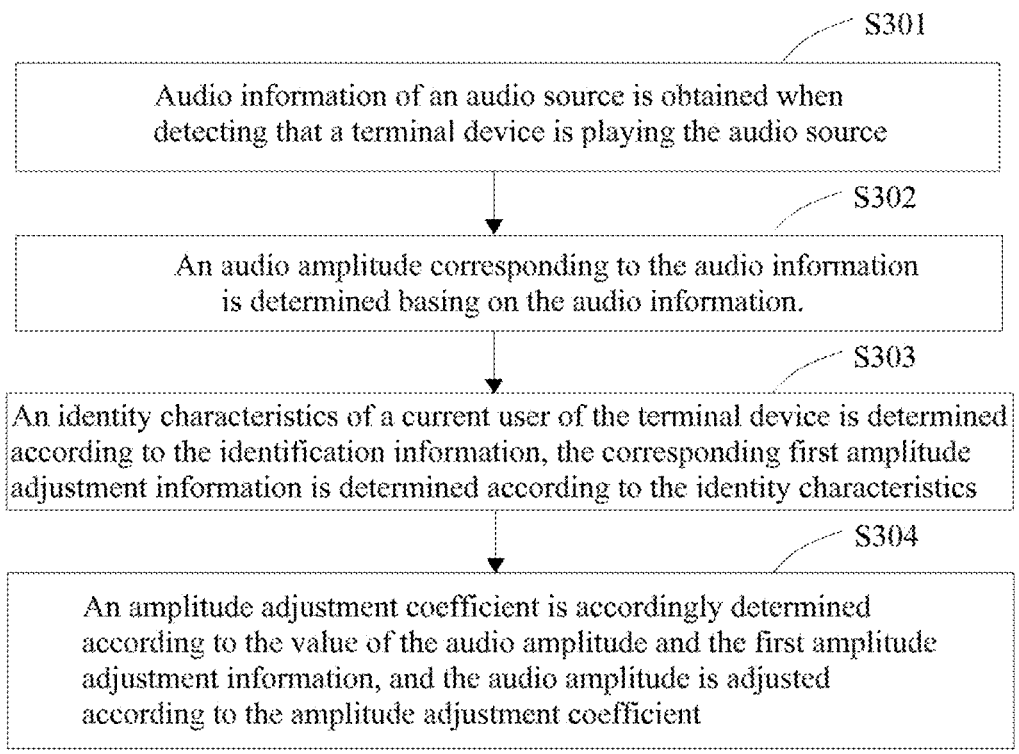
FIG. 3 illustrates a flowchart of still another volume adjusting method, in accordance with still another embodiment of the present disclosure.

FIG. 3 illustrates a flowchart of still another volume adjusting method according to still another embodiment of the present disclosure. Alternatively, before assigning the amplitude adjustment coefficient to the audio source according the value of the audio amplitude, the method further includes: determining identity characteristics of a user of the terminal device according to identification verification information, and determining a first amplitude adjustment information according to the identity characteristics. Correspondingly, when the amplitude adjustment coefficient is assigned according to the value of the audio amplitude, the operation may include: determining the amplitude adjustment coefficient according to value of the audio amplitude and the first amplitude adjustment information. As illustrated in FIG. 3, the volume adjusting method specifically includes:

At the block S301, audio information of an audio source is obtained when detecting that a terminal device is playing the audio source.

At the block S302, an audio amplitude corresponding to the audio information is determined, basing on the audio information.

At the block S303, an identity characteristics of a current user of the terminal device is determined according to the identification information, and the corresponding first amplitude adjustment information is determined according to the identity characteristics.

In one embodiment, the current user may be identified via a fingerprint module of the terminal device. Then the first amplitude adjustment information is correspondingly determined according to the stored identity properties of users, such as occupation, age, gender, etc. The first amplitude adjustment information can be a correction factor. Exemplarily, when the user is determined as younger, such as smaller than 15 years old, the first amplitude adjustment information may be corresponding determined as 0.8. That is, an original amplitude adjustment coefficient previously determined is multiplied by 0.8 to obtain the amplitude adjustment coefficient after adjusted.

At the block S304, an amplitude adjustment coefficient is accordingly determined according to the value of the audio amplitude and the first amplitude adjustment information, and the audio amplitude is adjusted according to the amplitude adjustment coefficient.

It can be known from the above that the properties of the users are involved in the operation of adjusting the audio amplitude. So that the adjustment of the volume is more in line with the needs of the user, and can be adjusted according to adaptabilities of different users.

Figure 4:
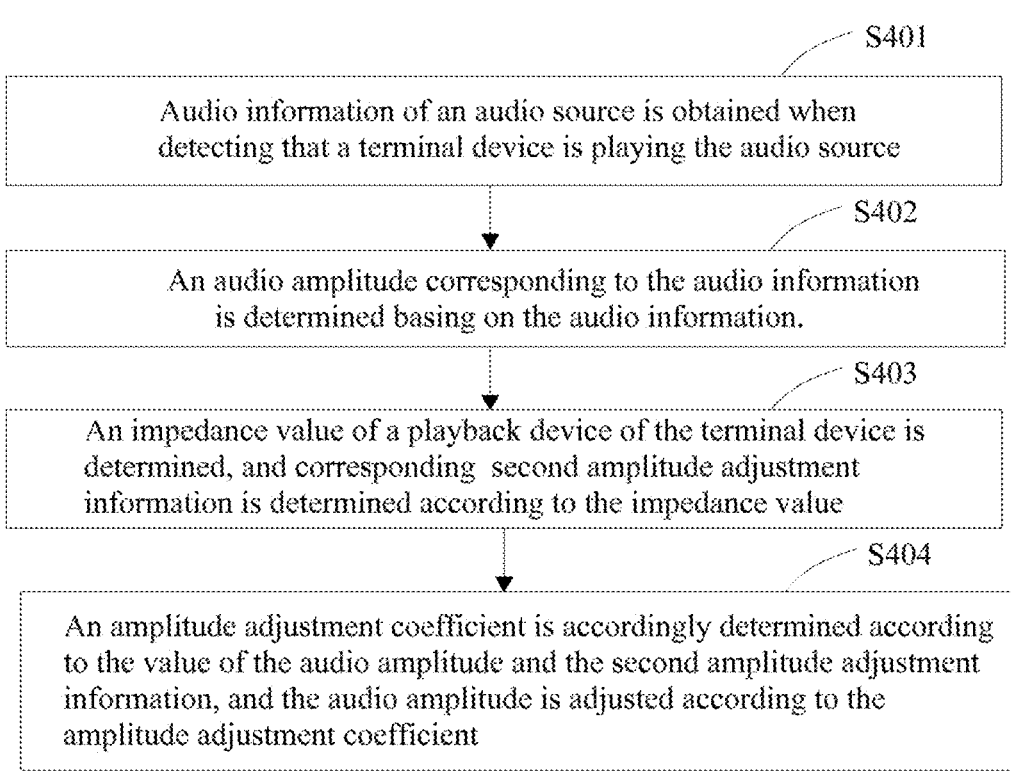
FIG. 4 illustrates a flowchart of again another volume adjusting method, in accordance with again another embodiment of the present disclosure.

FIG. 4 illustrates a flowchart of another volume adjusting method according to still another embodiment of the present disclosure. Alternatively, before assigning the amplitude adjustment coefficient to the audio source according the value of the audio amplitude, the method further includes: determining an impedance value of a playback component of the terminal device, and determining corresponding second amplitude adjustment information according to the impedance value. Correspondingly, when the amplitude adjustment coefficient is assigned according to the value of the audio amplitude, the operation may include: determining the amplitude adjustment coefficient according to value of the audio amplitude and the second amplitude adjustment information. As illustrated in FIG. 4, the volume adjusting method specifically includes:

At the block S401, audio information of an audio source is obtained when detecting that a terminal device is playing the audio source.

At the block S402, an audio amplitude corresponding to the audio information is determined, basing on the audio information.

At the block S403, an impedance value of a playback component of the terminal device is determined, and corresponding second amplitude adjustment information is determined according to the impedance value.

In one embodiment, the impedance value of a playback component (such as a speaker) installed in the terminal device can be detected by a power amplifier chip. Alternatively, the impedance value of the playback component can also be detected by a physical method. The second amplitude adjustment information may be a correction coefficient.

At the block S404, an amplitude adjustment coefficient is accordingly determined according to the value of the audio amplitude and the second amplitude adjustment information, and the audio amplitude is adjusted according to the amplitude adjustment coefficient.

Exemplarily, in an assumptions, the playback component has a nominal impedance value of x, and the impedance value is determined to 1.2× after detection, thereby the corresponding second amplitude adjustment information may be determined to be 1.2. That is, when the amplitude adjustment coefficient is assigned to the audio amplitude, the assigned amplitude adjustment coefficient is multiplied by 1.2 to obtain the amplitude adjustment coefficient after adjusted.

It can be known from the above that the impedance value of the playback component is involved in the operation of adjusting the audio amplitude, which protects the volume in a normal playback operation from being influenced by the impedance value of the playback component that is increasing with time of playing, and ensures that the volume level after adjusted to better meet the user's needs, and further improves a volume adjustment effect.

Figure 5:
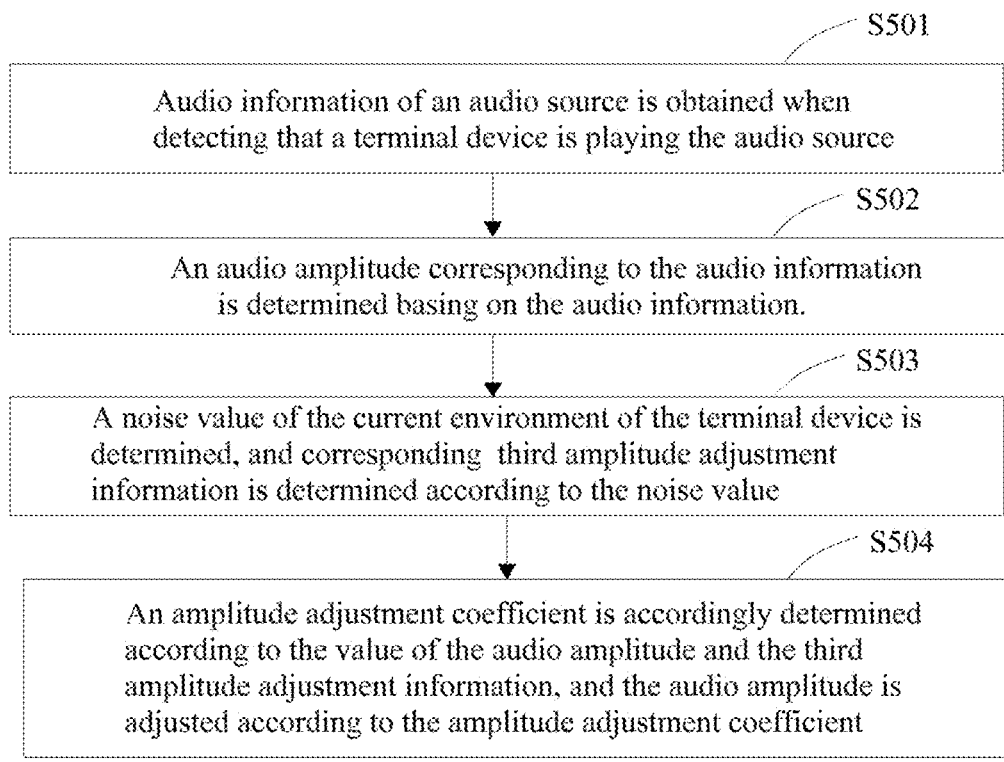
FIG. 5 illustrates a flowchart of still again another volume adjusting method, in accordance with still again another embodiment of the present disclosure.

FIG. 5 illustrates a flowchart of another volume adjusting method according to still another embodiment of the present disclosure. Alternatively, before assigning the amplitude adjustment coefficient to the audio source according the value of the audio amplitude, the method further includes: determining a noise value of a current environment in which the terminal device is located, and determining corresponding third amplitude adjustment information according to the noise value. Correspondingly, when the amplitude adjustment coefficient is assigned according to the value of the audio amplitude, the operation may include: determining the amplitude adjustment coefficient according to value of the audio amplitude and the corresponding third amplitude adjustment information. As illustrated in FIG. 5, the volume adjusting method specifically includes:

At the block S501, audio information of an audio source is obtained when detecting that a terminal device is playing the audio source.

At the block S502, an audio amplitude corresponding to the audio information is determined, basing on the audio information.

At the block S503, a noise value of the current environment of the terminal device is determined, and corresponding third amplitude adjustment information is determined according to the noise value.

In one embodiment, a microphone of the terminal device may be configured to collect noises of the current environment, thereby the noise value may be determined correspondingly. The third amplitude adjustment information may be a correction coefficient.

At the block S504, an amplitude adjustment coefficient is accordingly determined according to the value of the audio amplitude and the third amplitude adjustment information, and the audio amplitude is adjusted according to the amplitude adjustment coefficient.

Exemplarily, in an assumptions, the noise value of the terminal device in a quiet environment is y, and the noise value is determined to be 1.5 y when the terminal device is outdoors or in a noisy environment, thus the corresponding third amplitude adjustment information may be determined to be 1.5. That is, when the amplitude adjustment coefficient is assigned to the audio amplitude, the assigned amplitude adjustment coefficient is multiplied by 1.5 to obtain the amplitude adjustment coefficient after adjusted.

As can be known from the above discussion, an influence of noise on the volume of the terminal device is involved in the operation of adjusting the audio amplitude, and the determined noise value is used as one of the parameters for determining the amplitude adjustment coefficient, which ensures that the volume level after adjusted to better meet the user's needs, and further improves a volume adjustment effect.

Figure 6:
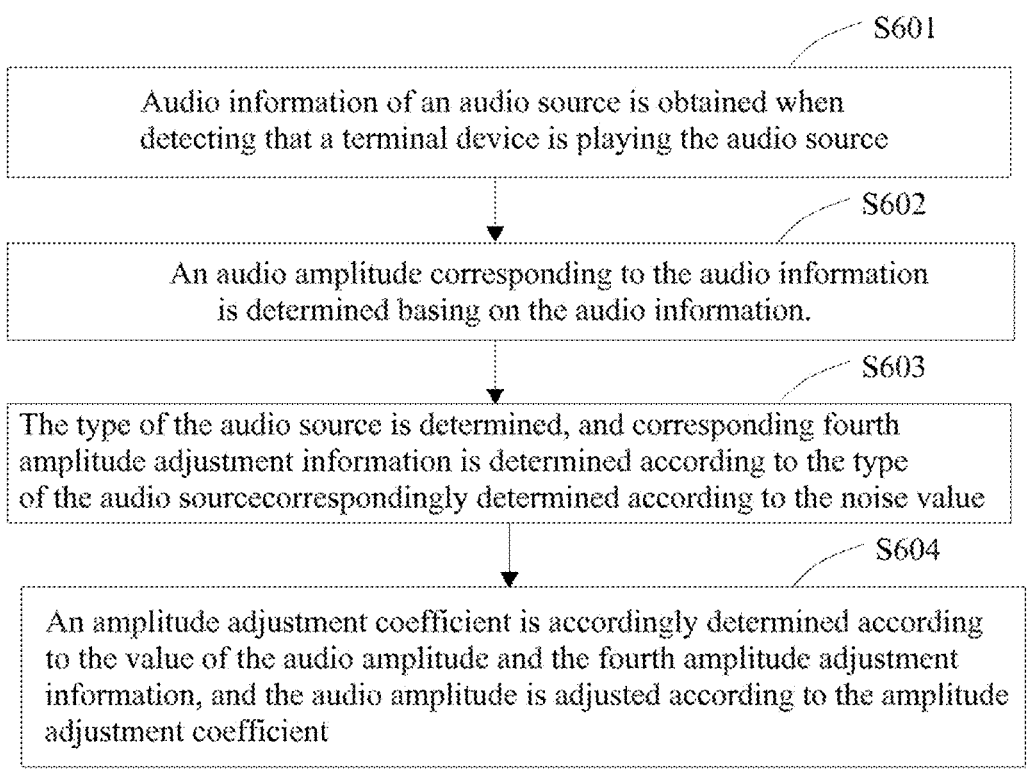
FIG. 6 illustrates a flowchart of still again another volume adjusting method, in accordance with still again another embodiment of the present disclosure.

FIG. 6 is a flowchart of another volume adjusting method according to still another embodiment of the present disclosure. Alternatively, before assigning the amplitude adjustment coefficient to the audio source according the value of the audio amplitude, the method further includes: determining the type of the audio source, and determining corresponding fourth amplitude adjustment information according to the type of the audio source. Correspondingly, when the amplitude adjustment coefficient is assigned according to the value of the audio amplitude, the operation may include: determining the amplitude adjustment coefficient according to value of the audio amplitude and the fourth amplitude adjustment information. As illustrated in FIG. 6, the volume adjusting method specifically includes:

At the block S601, audio information of an audio source is obtained when detecting that a terminal device is playing the audio source.

At the block S602, an audio amplitude corresponding to the audio information is determined, basing on the audio information.

At the block S603, the type of the audio source is determined, and corresponding fourth amplitude adjustment information is determined according to the type of the audio source.

Exemplarily, the type of the audio source may be a music type, such as a song file for playing, or an episode in an audio or video file, or music entrained in an audio or video file. The type of the audio source can be a dialogue type, such as dialogues between characters in a movie being played. The type of the audio source can also be a noise, such as noises during a call, or noises in a movie. In one embodiment, the type of audio source may be correspondingly determined by analyzing a characteristics information of the audio source. The type of the audio source may also be determined by analyzing the audio amplitude. For example, when a curve waveform of the audio amplitude is irregularly distributed, the audio source may be determined as a noise. As mentioned above, the fourth amplitude adjustment information may be a correction coefficient. When the type of the audio source is determined to be a music type, the assigned amplitude adjustment coefficients are multiplied by 1.2 to obtain the amplitude adjustment coefficient after adjusted.

At the block S604, an amplitude adjustment coefficient is accordingly determined according to the value of the audio amplitude and the fourth amplitude adjustment information, and the audio amplitude is adjusted according to the amplitude adjustment coefficient.

It can be known from the above that in the operation of adjusting the audio amplitude, the type of the audio source is introduced as an adjustment correction parameter, which ensure that the adjustment of the audio amplitude more reasonable.

Figure 7:
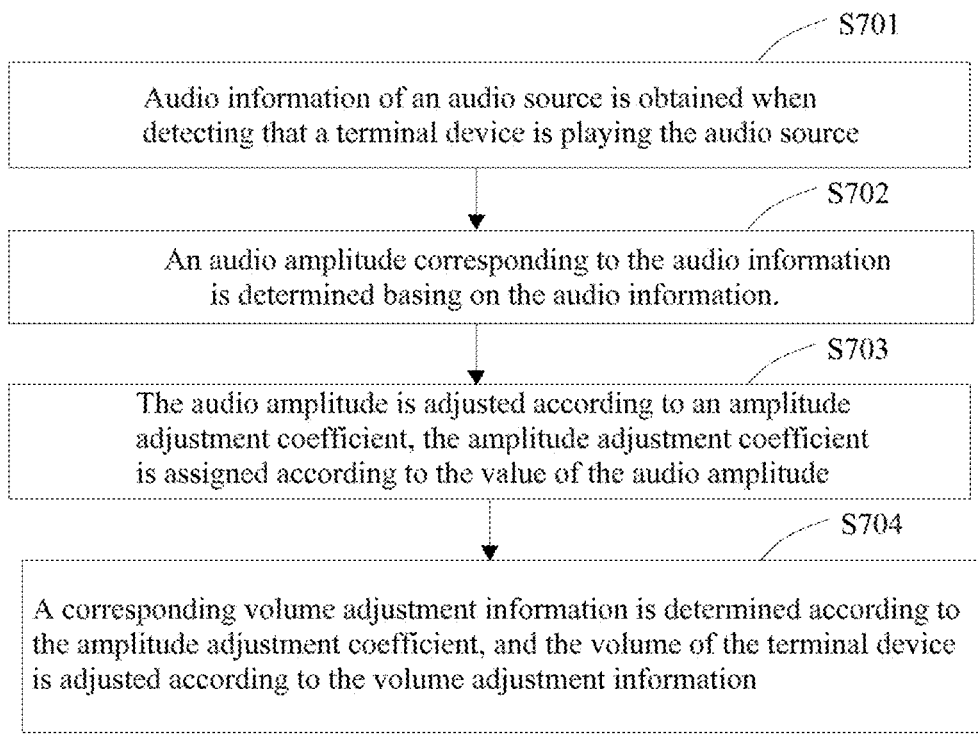
FIG. 7 illustrates a flowchart of still again another volume adjusting method, in accordance with still again another embodiment of the present disclosure.

FIG. 7 illustrates a flowchart of another volume adjusting method according to still another embodiment of the present disclosure. Alternatively, after the audio amplitude has been adjusted according to the amplitude adjustment coefficient, the method may further include: determining corresponding volume adjustment information according to the amplitude adjustment coefficient, and adjusting the volume of the terminal device according to the volume adjustment information. As illustrated in FIG. 7, the volume adjusting method specifically includes:

At the block S701, audio information of an audio source is obtained when detecting that a terminal device is playing the audio source.

At the block S702, an audio amplitude corresponding to the audio information is determined, basing on the audio information.

At the block S703, the audio amplitude is adjusted according to an amplitude adjustment coefficient, the amplitude adjustment coefficient is assigned according to the value of the audio amplitude.

At the block S704, a corresponding volume adjustment information is determined according to the amplitude adjustment coefficient, and the volume of the terminal device is adjusted according to the volume adjustment information.

In one embodiment, the corresponding volume adjustment information is correspondingly determined according to the amplitude adjustment coefficient. Exemplarily, when the amplitude adjustment coefficient is greater than 1, the volume adjustment information is determined to be a volume increase information. When the amplitude adjustment coefficient is smaller than 1, the volume adjustment information is determined to be a volume decrease information. Specifically in one embodiment, the volume increase or decrease information is a corresponding target volume value. Exemplarily, the terminal device may have a volume parameter divided in to 18 levels from zero to maximum in total, and the 18 levels may be adjusted. Each of the levels corresponds to a volume value. The target volume value corresponding to the volume decrease information may be 3 or 4. The target volume value corresponding to the volume increase information can be 14 or 15. When the audio source amplitude is determined to be in a small level, the volume value may be increased to 14 or 15 accordingly. When the audio source amplitude is determined to be in a great value, the volume value is decreased to 3 or 4 accordingly. In another embodiment, the volume increase or decrease information is a corresponding volume change value. Exemplarily, the terminal device may have a volume parameter divided in to 18 levels from zero to maximum in total, and the 18 levels may be adjusted. Each of the levels corresponds to a volume value. The volume change values corresponding to the volume increase information and the volume decrease information are both 3. For example, the current volume value of the terminal device is 10. When the volume information needs to be increased, the current volume value of the terminal device is increased by 3. That is, the audio is playing in the 13th volume. When the volume information needs to be decreased, the current volume value of the terminal device is decreased by 3. That is, the audio is playing in the 7th volume. Alternatively, before adjusting the volume value of the terminal device, the method further includes: determining a playing duration of the audio source, and when the playing duration is greater than a predetermined threshold, such as 30 s, adjusting the current volume of the terminal device using volume change value corresponding to the volume increase information or the volume decrease information, thereby further improving an efficiency of volume adjustment and reducing an energy consumption of the terminal device.

Therefore, an adaptive adjustment of the volume of the terminal device is achieved while the amplitude of the audio source is adjusted, which enhances the adjustment effect. So that the volume of the audio source is better and moderate, which meets user needs.

Figure 8:
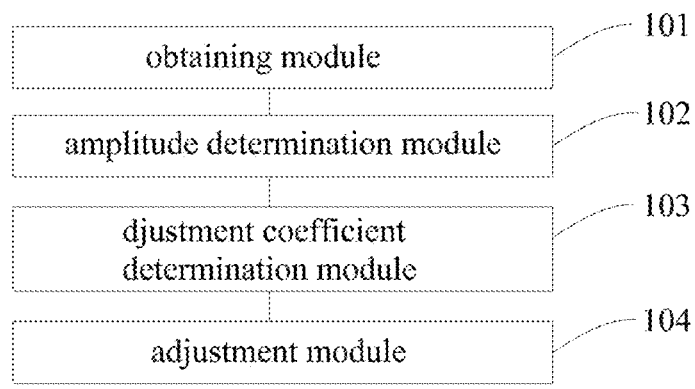
FIG. 8 illustrates a functional block diagram of a volume adjusting device, in accordance with an embodiment of the present disclosure.

FIG. 8 illustrates a functional block diagram of a volume adjusting device according to an embodiment of the present disclosure. The volume adjusting device is configured to execute the volume adjusting method provided by the foregoing embodiments, and includes function modules and beneficial effects corresponding to the volume adjusting method. As illustrated in FIG. 8, the volume adjusting device includes: an obtaining module 101, an amplitude determination module 102, an adjustment coefficient determination module 103, and an adjustment module 104.

The obtaining module 101 is configured to obtain audio information of an audio source when detecting that a terminal device is playing the audio source.

The terminal device can play the audio source via a third-party applications installed therein, or via an audio or video playback software integrated therein. When the terminal device is playing the audio source, it may obtain, decode, and output an audio source file corresponding to the audio source. Exemplarily, the audio source file obtained by the terminal device may be a multicast stream transmitted from a network. The audio source file obtained by the terminal device may also be an audio/video file stored locally in the terminal device. The terminal device may load the audio source file into a memory buffer thereof after obtaining the audio source file. And then the audio source file in the memory buffer is decoded. When the audio source file contains both of video data and audio data, the audio data should be separated from the video data before the audio source file is decoded. And the separated audio data is transmitted to an audio decoder. The audio decoder is mainly configured to read the audio data in the memory buffer, obtain digital audio signals, and convert the digital audio signals into analog audio signals. The playback component of the terminal device may paly audios according to the analog audio signals. In one embodiment, the terminal device is determined to start to play the audio source when an audio source playback event is triggered. The triggered audio source playback event may be detecting that a playback button on a touch display panel of the terminal device is pressed, or maybe detecting that a playback component of the terminal device such as a speaker starts to generate sound signals, then the terminal device is determined to play the audio source.

The audio information of the audio source is obtained when it is detected that the terminal device is playing the audio source. In one embodiment, the digital audio signals decoded by the audio decoder may be sampled to obtain the audio information corresponding to the audio source. In another embodiment, an original file of the playing audio source may be obtained, and the audio information corresponding to the audio source may be obtained by analyzing the original file. In still another embodiment, taking the Android system as an example, the audio information of the audio source can be obtained via the android.media.MediaRecorder class or the android.media.AudioRecord class.

The amplitude determination module 102 is configured to determine an audio amplitude corresponding to the audio information according to the audio information.

An amplitude indicates a maximum distance of an object from an original position when the object is vibrating. A loudness of the sound heard by the human ear is related to the audio amplitude of the audio source. The larger the amplitude is, the larger the loudness is. In one embodiment, the digital audio signals decoded by the audio decoder may be sampled to obtain amplitude information within a predetermined duration T. The amplitude information may include multiple amplitude values. An amplitude waveform of the audio source lasting in the predetermined duration T may be correspondingly formed according to the multiple amplitude values. In another embodiment, taking the Android system as an example, the multiple amplitude values can be correspondingly obtained after the audio information of the audio source has been obtained via the android.media.MediaRecorder class or the android.media.AudioRecord class. In another embodiment, when the audio information obtained at the block S101 is an original file corresponding to the audio source, the corresponding amplitude values may be obtained by analyzing the original file.

In one embodiment, when it is detected that the audio source is playing, the audio amplitude is determined every predetermined duration (such as 1$s$, 3$s$, or 10$s$). Alternatively, the audio amplitude of each audio frame of the audio information may also be determined in real time. Specifically, in the operation of determining the audio information of the audio source, audio frame information of the audio source is obtained. Correspondingly, in the operation of determining the audio amplitude of the audio source according to the audio information, the audio amplitude of each of the audio frames of the audio source is determined according to the audio frame information. Exemplarily, when the audio source is determined to be played, an audio frame sequence is obtained by analyzing the audio source file, and the audio amplitude of the audio frame is correspondingly determined according to each frame of the audio frame sequence.

The adjustment coefficient determination module 103 is configured to assign the amplitude adjustment coefficient to the audio source according to the value of the audio amplitude.

In one embodiment, different amplitude adjustment coefficients may be determined according to the determined different values of the audio amplitude, and the audio amplitude is adjusted according to corresponding amplitude adjustment coefficient. In the operation of adjusting the audio amplitude, the audio source file containing the audio information can be analyzed to obtain an audio data, and the data in the obtained audio data which indicates the amplitude information can be modified and then encapsulated, so when the corresponding audio source file is read into the buffer and playing, the audio amplitude corresponding to the audio source file has been correspondingly adjusted. In an alternative embodiment, in the decoding process of playing the audio source, the obtained digital audio signals are analyzed to obtain amplitude data, the amplitude data may be multiplied by a corresponding adjustment coefficient to modify the value of the amplitude, and then the volume of the audio source may be adjusted. As a result, the volume of the audio source can be adjusted without changing a current volume of the terminal device. The adjustment operation to the volume of the audio source can performed before the audio source is read into the buffer, thereby a playback load may be reduced. In an alternative embodiment, the adjustment operation may be applied to the audio source that has been read into the buffer, thereby improving an efficiency of adjustment.

The adjustment module 104 is configured to adjust the audio amplitude according to the amplitude adjustment coefficient.

In the technical solution provided in the illustrated embodiment, audio information of an audio source is obtained when detecting that a terminal device is playing the audio source. An audio amplitude corresponding to the audio information is determined basing on the audio information. The amplitude adjustment coefficient is assigned to the audio source according to the value of the audio amplitude, and the audio amplitude is adjusted according to the amplitude adjustment coefficient. This solution improves the efficiency of volume adjustment and reduces the power consumption of the terminal device.

In a possible embodiment, the adjustment coefficient determination module 103 is specifically configured to:

assign a first amplitude adjustment coefficient to the audio amplitude whose value is greater than a first predetermined threshold or smaller than a third predetermined threshold;

assign a second amplitude adjustment coefficient to the audio amplitude whose value is smaller than or equal to the first predetermined threshold but greater than a second predetermined threshold; and assign a third amplitude adjustment coefficient to the audio amplitude whose value is smaller than or equal to the second predetermined threshold but greater than the third predetermined threshold. The first amplitude adjustment coefficient is smaller than the second amplitude adjustment coefficient, and the second amplitude adjustment coefficient is smaller than the third amplitude adjustment coefficient.

In a possible embodiment, the amplitude determination module 102 is further configured to:

determine the audio amplitude of the audio information which meets a predetermined frequency, before assigning the amplitude adjustment coefficient to the audio source according the value of the audio amplitude.

The adjustment coefficient determination module 103 is specifically configured to:

assign a first amplitude adjustment coefficient to the audio amplitude that meets the predetermined frequency In a possible embodiment, the adjustment module 104 is further configured to:

determine identity characteristics of a user of the terminal device according to an identification verification information, and determine a first amplitude adjustment information according to the identity characteristics, before assigning the amplitude adjustment coefficient to the audio source according the value of the audio amplitude.

The adjustment coefficient determination module 103 is specifically configured to:

determine the amplitude adjustment coefficient according to value of the audio amplitude and the first amplitude adjustment information.

In a possible embodiment, the adjustment module 104 is further configured to:

determine an impedance value of a playback component of the terminal device, and determine corresponding second amplitude adjustment information according to the impedance value, before assigning the amplitude adjustment coefficient to the audio source according the value of the audio amplitude.

The adjustment coefficient determination module 103 is specifically configured to:

determine the amplitude adjustment coefficient according to value of the audio amplitude and the second amplitude adjustment information.

In a possible embodiment, the adjustment module 104 is further configured to:

determine a noise value of a current environment in which the terminal device is located, and determine corresponding third amplitude adjustment information according to the noise value, before assigning the amplitude adjustment coefficient to the audio source according the value of the audio amplitude.

The adjustment coefficient determination module 103 is specifically configured to:

determine the amplitude adjustment coefficient according to value of the audio amplitude and the third amplitude adjustment information.

In a possible embodiment, the adjustment module 104 is further configured to:

determine the type of the audio source, and determine corresponding fourth amplitude adjustment information according to the type of the audio source, before assigning the amplitude adjustment coefficient to the audio source according the value of the audio amplitude.

The adjustment coefficient determination module 103 is specifically configured to:

determine the amplitude adjustment coefficient according to value of the audio amplitude and the fourth amplitude adjustment information.

In a possible embodiment, the adjustment module 104 is further configured to:

dynamically adjust the second predetermined threshold and the third predetermined threshold according to the current volume of the terminal device before assigning the amplitude adjustment coefficient to the audio source according the value of the audio amplitude.

In a possible embodiment, the adjustment module 104 is further configured to:

determine a corresponding volume adjustment information according to the amplitude adjustment coefficient after the audio amplitude has been adjusted according to the amplitude adjustment coefficient; and adjust the volume of the terminal device according to the volume adjustment information.

Figure 9:
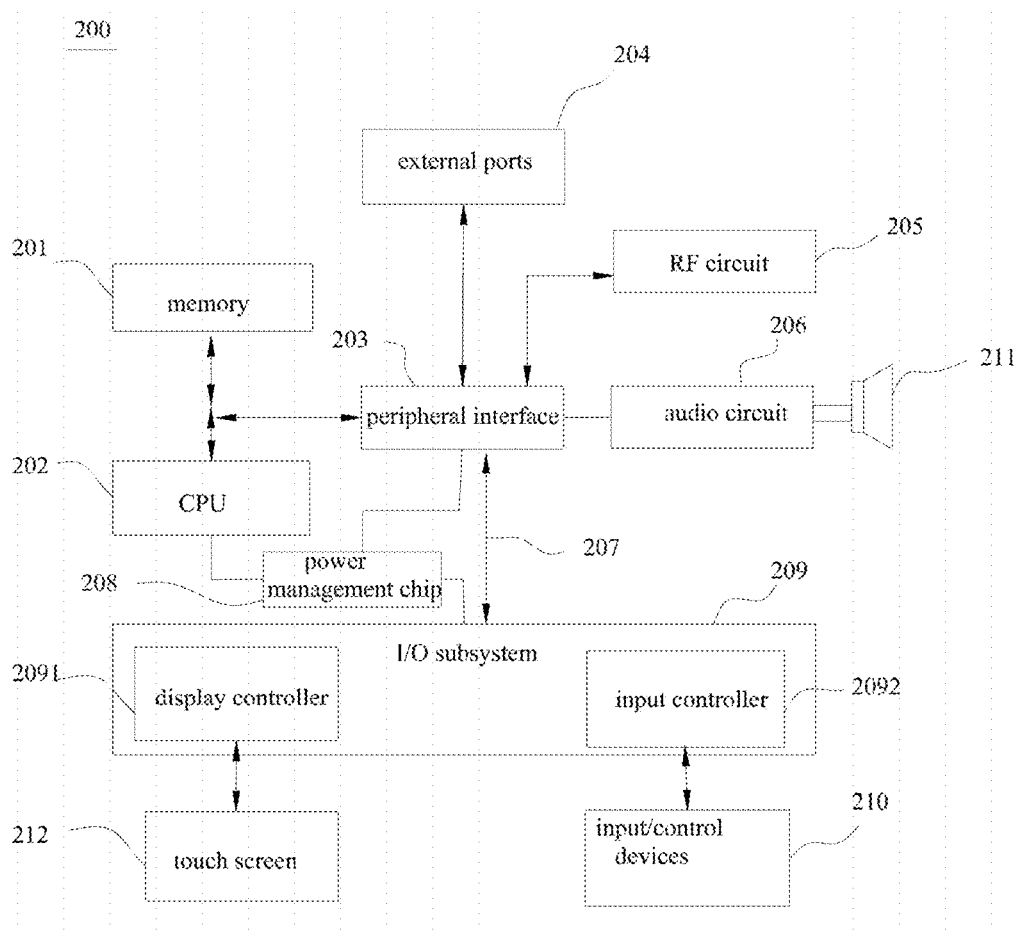
FIG. 9 illustrates a schematic structural view of a terminal device, in accordance with an embodiment of the present disclosure.

The present illustrated embodiment provides a terminal device based on the foregoing embodiments, and the terminal device may include a volume adjusting device provided by the present disclosure. FIG. 9 illustrates a schematic structural view of another terminal device according to an embodiment of the present disclosure. As illustrated in FIG. 9, the terminal device 200 includes a memory 201, a central processing unit (CPU) 202, a peripheral interface 203, a Radio Frequency (RF) circuit 205, an audio circuit 206, a speaker 211, a power management chip 208, an input/output (I/O) subsystem 209, a touch screen 212, other input/control devices 210, and external ports 204. These components may perform communication functions via communication buses or signal lines 207.

It should be understood that the illustrated terminal device 200 is only an example of the terminal device, and the terminal device 200 may have more or fewer components than those illustrated in the figure, and two or more components may be combined. Alternatively, the terminal device 200 can have component configurations different from those illustrated in the figure. The various components illustrated in the figures can be implemented in hardware, software, or a combination of hardware and software, including one or more signal processing and/or application specific integrated circuits.

The terminal device for permission management of multiple applications provided in the illustrated embodiment is described in detail below. The terminal device may be a smart phone as an example.

The memory 201 can be accessed by the CPU 202, the peripheral interface 203, etc. The memory 201 can include a high-speed random-access memory, and can also include a non-volatile memory, such as one or more disk storage devices, flash memory devices, or other volatile solid-state storage devices.

The peripheral interface 203 can connect input and output peripherals of the terminal device to the CPU 202 and the memory 201.

The I/O subsystem 209 can connect the input/output peripherals that is connecting to the device, such as touch screen 212 and other input/control devices 210, to the peripheral interface 203. The I/O subsystem 209 may include a display controller 2091 and one or more input controllers 2092 for controlling other input/control devices 210. Among them, one or more input controllers 2092 may receive electrical signals from or send electrical signals to other input/control devices 210, and other input/control devices 210 may include physical buttons (press buttons, rocker buttons, etc.), dial keys, slide switches, joysticks, click wheels. It is worth noting that the input controller 2092 can be connected to any of the following: a keyboard, an infrared port, a USB interface, and a pointing device such as a mouse.

The touch screen 212 is an input interface and an output interface between a terminal and a user, and configured to display a visual output to the user. The visual output may include graphics, texts, icons, videos, and the like.

The display controller 2091 of the I/O subsystem 209 is configured to receive electric signals from the touch screen 212 or send electric signals to the touch screen 212. The touch screen 212 is configured to detect a contact thereon, and the display controller 2091 is configured to convert the detected contact into interaction with a user interface object displayed on the touch screen 212. That is, human-computer interaction is achieved. The user interface objects displayed on the touch screen 212 may be operation icon for games, icons connected to the appropriate network, etc. It is worth noting that the device may also include a light mouse, which is a touch-sensitive surface that does not display visual output, or an extension of the touch-sensitive surface formed by a touch screen.

The RF circuit 205 is mainly used to establish communication between a mobile phone and a wireless network (that is, a network side), and realize data reception and transmission of the mobile phone and the wireless network. For example, the RF circuit 205 is configured to send and receive text messages, e-mail, and so on. Specifically, the RF circuit 205 receives and sends an RF signal. The RF signal is also referred to an electromagnetic signal. The RF circuit 205 converts an electric signal into an electromagnetic signal or converts an electromagnetic signal into an electric signal, and communicates with the communication network and other devices via be electromagnetic signal for communication. The RF circuit 205 may include known circuits for performing these functions, including, but not limited to, an antenna systems, an RF transceivers, one or more amplifiers, tuners, one or more oscillators, digital signal processors, a COder-DECoder (CODEC) chipset, a subscriber Identity Module (SIM), etc.

The audio circuit 206 is mainly configured to receive audio data from the peripheral interface 203, and convert the audio data into an electrical signal, and send the electrical signal to the speaker 211.

The speaker 211 is configured to restore an audio signal, that is received by the mobile phone from the wireless network through via RF circuit 205, to a sound and play the sound to a user.

The power management chip 208 is configured to power supply and power management for the hardware connected to the CPU 202, the I/O subsystem, and the peripheral interface.

The volume adjusting device for a terminal device and the terminal device provided in the foregoing embodiments can perform the volume adjusting method for a terminal device provided by any embodiment of the present disclosure, and have corresponding function modules and beneficial effects for executing the method. For technical details not described in detail in the foregoing embodiments, reference may be made to a method for adjusting a volume of a terminal device provided in any embodiment of the present disclosure.

Embodiments of the present disclosure also provide a storage medium containing instructions that can be executed by a terminal device, where instructions that can be executed the terminal device are executed to perform a volume adjusting method, and the volume adjusting method includes:

acquiring audio information of an audio source when detecting that a terminal device is playing the audio source;

determining an audio amplitude corresponding to the audio information according to the audio information; and adjusting the audio amplitude according to an amplitude adjustment coefficient, the amplitude adjustment coefficient is assigned according to the value of the audio amplitude.

In a possible embodiment, when the amplitude adjustment coefficient is assigned according to the value of the audio amplitude, the operation includes:

assigning a first amplitude adjustment coefficient to the audio amplitude whose value is greater than a first predetermined threshold or smaller than a third predetermined threshold;

assigning a second amplitude adjustment coefficient to the audio amplitude whose value is smaller than or equal to the first predetermined threshold but greater than a second predetermined threshold; and assigning a third amplitude adjustment coefficient to the audio amplitude whose value is smaller than or equal to the second predetermined threshold but greater than the third predetermined threshold. The first amplitude adjustment coefficient is smaller than the second amplitude adjustment coefficient, and the second amplitude adjustment coefficient is smaller than the third amplitude adjustment coefficient.

In a possible embodiment, before assigning the amplitude adjustment coefficient according to the value of the audio amplitude, the method further includes:

determine the audio amplitude of the audio information which meets a predetermined frequency.

Correspondingly, when the amplitude adjustment coefficient is assigned according to the value of the audio amplitude, the operation includes:

assigning a first amplitude adjustment coefficient to the audio amplitude that meets the predetermined frequency.

In a possible embodiment, before assigning the amplitude adjustment coefficient according to the value of the audio amplitude, the method further includes:

determining identity characteristics of a user of the terminal device according to identification verification information, and determining a first amplitude adjustment information according to the identity characteristics.

Correspondingly, when the amplitude adjustment coefficient is assigned according to the value of the audio amplitude, the operation includes:

determining the amplitude adjustment coefficient according to value of the audio amplitude and the first amplitude adjustment information.

In a possible embodiment, before assigning the amplitude adjustment coefficient according to the value of the audio amplitude, the method further includes:

determining an impedance value of a playback component of the terminal device, and determining corresponding second amplitude adjustment information according to the impedance value.

Correspondingly, when the amplitude adjustment coefficient is assigned according to the value of the audio amplitude, the operation includes:

determining the amplitude adjustment coefficient according to value of the audio amplitude and the second amplitude adjustment information.

In a possible embodiment, before assigning the amplitude adjustment coefficient according to the value of the audio amplitude, the method further includes:

determining a noise value of a current environment in which the terminal device is located, and determining corresponding third amplitude adjustment information according to the noise value.

Correspondingly, when the amplitude adjustment coefficient is assigned according to the value of the audio amplitude, the operation includes:

determining the amplitude adjustment coefficient according to value of the audio amplitude and the third amplitude adjustment information.

In a possible embodiment, before assigning the amplitude adjustment coefficient according to the value of the audio amplitude, the method further includes:

determining the type of the audio source, and determining corresponding fourth amplitude adjustment information according to the type of the audio source.

Correspondingly, when the amplitude adjustment coefficient is assigned according to the value of the audio amplitude, the operation includes:

determining the amplitude adjustment coefficient according to value of the audio amplitude and the fourth amplitude adjustment information.

In a possible embodiment, before assigning the amplitude adjustment coefficient according to the value of the audio amplitude, the method further includes:

dynamically adjusting the second predetermined threshold and the third predetermined threshold according to the current volume of the terminal device.

In a possible embodiment, after adjusting the audio amplitude according to the amplitude adjustment coefficient, the method further includes:

determining corresponding volume adjustment information according to the amplitude adjustment coefficient; and adjusting the volume of the terminal device according to the volume adjustment information.

Storage medium may refer to any of various types of memory devices or storage devices. The term "storage media" is intended to include: installation media, such as CD-ROM, floppy disks, or magnetic tape devices; computer system memory or random-access memory such as DRAM, DDR RAM, SRAM, EDO RAM, Rambus RAM, etc.; Non-volatile memory, such as flash memory, magnetic media (such as hard disk or optical storage); registers or other similar types of memory elements, etc. The storage medium may further include other types of memory or a combination thereof. In addition, the storage medium may be located in a first computer system in which the program is executed, or may be located in a different second computer system connected to the first computer system through a network such as the Internet. The second computer system may provide program instructions to the first computer for execution. The term "storage medium" may include two or more storage media that may reside in different locations, such as in different computer systems connected through a network. The storage medium may store program instructions (for example, embodied as a computer program) executable by one or more processors.

Of course, a storage medium containing computer-executable instructions provided in the embodiments of the present disclosure is not limited to the volume adjusting method described above, and may also perform the volume adjusting method provided by any embodiment of the present disclosure Related operations in.

It is worth noting that the above are only the preferred embodiments of the present disclosure and the applied technical principles. Those skilled in the art will understand that the present disclosure is not limited to the specific embodiments described herein, and those skilled in the art can make various obvious changes, readjustments and substitutions without departing from the scope of protection of the present disclosure. Therefore, although the present disclosure has been described in more detail through the above embodiments, the present disclosure is not limited to the above embodiments, and without departing from the concept of the present disclosure, it may include more other equivalent embodiments, and the present disclosure. The scope is determined by the scope of the appended claims.

What is claimed is:

1. A volume adjusting method, comprising:
    acquiring audio information of an audio source when detecting that a terminal device is playing the audio source;
    determining an audio amplitude corresponding to the audio information according to the audio information;
    determining identity characteristics of a user of the terminal device according to identification verification information, and determining a first amplitude adjustment information according to the identity characteristics, the first amplitude adjustment information being a correction factor;
    assigning an amplitude adjustment coefficient according to a value of the audio amplitude, comprising: determining a previous amplitude adjustment coefficient according to value of the audio amplitude, and obtaining the amplitude adjustment coefficient by multiplying the previous amplitude adjustment coefficient by the correction factor; and
    adjusting the audio amplitude according to an amplitude adjustment coefficient.

2. The method according to claim 1, wherein the amplitude adjustment coefficient being assigned according to the value of the audio amplitude comprises:
    assigning a first amplitude adjustment coefficient to the audio amplitude whose value is greater than a first predetermined threshold or smaller than a third predetermined threshold;
    assigning a second amplitude adjustment coefficient to the audio amplitude whose value is smaller than or equal to the first predetermined threshold but greater than a second predetermined threshold;
    assigning a third amplitude adjustment coefficient to the audio amplitude whose value is smaller than or equal to the second predetermined threshold but greater than the third predetermined threshold;
    wherein the first amplitude adjustment coefficient is smaller than the second amplitude adjustment coefficient, and the second amplitude adjustment coefficient is smaller than the third amplitude adjustment coefficient.

3. The method according to claim 2, before assigning the amplitude adjustment coefficient according to the value of the audio amplitude, the method further comprising:
    determining the audio amplitude of the audio information which meets a predetermined frequency;
    correspondingly, the amplitude adjustment coefficient being assigned according to the value of the audio amplitude comprising:
        assigning a first amplitude adjustment coefficient to the audio amplitude that meets the predetermined frequency.

4. The method according to claim 2, wherein before assigning the amplitude adjustment coefficient according to the value of the audio amplitude, the method further comprises:
dynamically adjusting the second predetermined threshold and the third predetermined threshold according to the current volume of the terminal device.

5. The method according to claim 1, wherein before assigning the amplitude adjustment coefficient according to the value of the audio amplitude, the method further comprises:
determining an impedance value of a playback component of the terminal device, and determining corresponding second amplitude adjustment information according to the impedance value;
correspondingly, the amplitude adjustment coefficient being assigned according to the value of the audio amplitude comprising:
determining the amplitude adjustment coefficient according to value of the audio amplitude and the second amplitude adjustment information.

6. The method according to claim 1, wherein before assigning the amplitude adjustment coefficient according to the value of the audio amplitude, the method further comprises:
determining a noise value of a current environment in which the terminal device is located, and determining corresponding third amplitude adjustment information according to the noise value;
correspondingly, the amplitude adjustment coefficient being assigned according to the value of the audio amplitude comprising:
determining the amplitude adjustment coefficient according to value of the audio amplitude and the third amplitude adjustment information.

7. The method according to claim 1, wherein before assigning the amplitude adjustment coefficient according to the value of the audio amplitude, the method further comprises:
determining a type of the audio source, and determining corresponding fourth amplitude adjustment information according to the type of the audio source;
correspondingly, the amplitude adjustment coefficient being assigned according to the value of the audio amplitude comprising:
determining the amplitude adjustment coefficient according to value of the audio amplitude and the fourth amplitude adjustment information.

8. The method according to claim 1, wherein after adjusting the audio amplitude according to the amplitude adjustment coefficient, the method further comprises:
determining corresponding volume adjustment information according to the amplitude adjustment coefficient; and
adjusting the volume of the terminal device according to the volume adjustment information.

9. The method according to claim 1, wherein the operation of adjusting the audio amplitude according to the amplitude adjustment coefficient comprises:
analyzing an audio source that containing the audio information to obtain an audio data; and
modify and encapsulate the data in the audio data which indicates the amplitude information.

10. The method according to claim 1, wherein the operation of adjusting the audio amplitude according to the amplitude adjustment coefficient comprises:
obtaining an amplitude data by analyzing digital audio signals obtained in a decoding process of playing the audio source; and
multiplying the amplitude data by a corresponding adjustment coefficient.

11. The method according to claim 1, wherein before the operation of determining audio information of an audio source when the audio source is played by a terminal device, the method further comprises:
obtaining an audio source file;
loading the audio source file into a memory buffer of the terminal device;
decoding the audio source file in the memory buffer to obtain analog audio signals; and
playing the audio source basing on the analog audio signals.

12. The method according to claim 11, wherein before the operation of decoding the audio source file in the memory buffer to obtain an analog audio signal comprises:
when the audio source file contains both of video data and audio data, separating the audio data from the video data;
transmitting the audio data to an audio decoder;
obtaining digital audio signals basing on the audio data; and
converting the digital audio signal into analog audio signals.

13. The method according to claim 11, wherein the operation of adjusting the audio amplitude according to an amplitude adjustment coefficient is perform before the audio source file is loaded into the memory buffer of the terminal device.

14. The method according to claim 11, wherein the operation of adjusting the audio amplitude according to an amplitude adjustment coefficient is perform to the audio source file that has been loaded into the memory buffer of the terminal device.

15. The method according to claim 1, wherein the operation of acquiring audio information of an audio source when detecting that a terminal device is playing the audio source comprises:
determining that the terminal device is playing the audio source when an audio source playback event is triggered; wherein the triggered audio source playback event is detecting that a playback button of the terminal device is pressed, or is detecting that a playback component of the terminal device starts to generate sound signals.

16. The method according to claim 1, wherein the operation of determining an audio amplitude corresponding to the audio information basing on the audio information comprises:
sampling a digital audio signal decoded by an audio decoder to obtain amplitude information of the audio source within a predetermined duration T; wherein the amplitude information contains multiple amplitude values; and
forming an amplitude waveform of the audio source lasting in the predetermined duration T according to the multiple amplitude values.

17. The method according to claim 1, wherein the operation of acquiring audio information of an audio source when detecting that a terminal device is playing the audio source comprises: obtaining an audio frame sequence by analyzing the audio source file when the audio source is played by a terminal device comprises;

wherein the operation of determining an audio amplitude corresponding to the audio information basing on the audio information comprises: obtaining the audio amplitude of each of the audio frames of the audio source according to each frame of the audio frame sequence.

18. A terminal device, comprising: a processor, a memory, and a computer program stored on the memory and executable by the processor, when executing the computer program the processor performing a volume adjusting method, wherein the method comprises:

acquiring audio information of an audio source when detecting that the terminal device is playing the audio source;

determining an audio amplitude corresponding to the audio information according to the audio information;

determining identity characteristics of a user of the terminal device according to identification verification information, and determining a first amplitude adjustment information according to the identity characteristics, the first amplitude adjustment information being a correction factor;

assigning an amplitude adjustment coefficient according to a value of the audio amplitude, comprising: determining a previous amplitude adjustment coefficient according to value of the audio amplitude, and obtaining the amplitude adjustment coefficient by multiplying the previous amplitude adjustment coefficient by the correction factor; and adjusting the audio amplitude according to an amplitude adjustment coefficient.

19. A volume adjusting method, comprising:

acquiring audio information of an audio source when detecting that a terminal device is playing the audio source;

determining an audio amplitude corresponding to the audio information according to the audio information;

assigning an amplitude adjustment coefficient according to a value of the audio amplitude; comprising:

assigning a first amplitude adjustment coefficient to the audio amplitude whose value is greater than a first predetermined threshold or smaller than a third predetermined threshold;

assigning a second amplitude adjustment coefficient to the audio amplitude whose value is smaller than or equal to the first predetermined threshold but greater than a second predetermined threshold; and assigning a third amplitude adjustment coefficient to the audio amplitude whose value is smaller than or equal to the second predetermined threshold but greater than the third predetermined threshold;

wherein the first amplitude adjustment coefficient is smaller than the second amplitude adjustment coefficient; the second amplitude adjustment coefficient is smaller than the third amplitude adjustment coefficient; the second predetermined threshold and the third predetermined threshold are dynamically adjusted according to a current volume of the terminal device; and adjusting the audio amplitude according to an amplitude adjustment coefficient.

20. The method according to claim 19, wherein after adjusting the audio amplitude according to the amplitude adjustment coefficient, the method further comprises:

determining corresponding volume adjustment information according to the amplitude adjustment coefficient; and adjusting the volume of the terminal device according to the volume adjustment information.

* * * * *